(12) United States Patent
Tang et al.

(10) Patent No.: US 12,142,702 B2
(45) Date of Patent: Nov. 12, 2024

(54) OPTOELECTRONIC DEVICE FORMED ON A FLEXIBLE SUBSTRATE

(71) Applicant: KING ABDULLAH UNIVERSITY OF SCIENCE AND TECHNOLOGY, Thuwal (SA)

(72) Inventors: Xiao Tang, Thuwal (SA); Xiaohang Li, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 377 days.

(21) Appl. No.: 17/774,235

(22) PCT Filed: Nov. 5, 2020

(86) PCT No.: PCT/IB2020/060425
§ 371 (c)(1),
(2) Date: May 4, 2022

(87) PCT Pub. No.: WO2021/094880
PCT Pub. Date: May 20, 2021

(65) Prior Publication Data
US 2022/0393046 A1    Dec. 8, 2022

Related U.S. Application Data

(60) Provisional application No. 62/934,046, filed on Nov. 12, 2019.

(51) Int. Cl.
*H01L 31/032* (2006.01)
*C23C 14/08* (2006.01)
(Continued)

(52) U.S. Cl.
CPC .......... *H01L 31/032* (2013.01); *C23C 14/08* (2013.01); *C23C 16/40* (2013.01); *C30B 23/025* (2013.01);
(Continued)

(58) Field of Classification Search
CPC .......... H01L 31/032; H01L 31/022408; H01L 31/09; H01L 31/03926; H01L 31/18; C23C 14/08; C23C 16/40; C23C 28/345
See application file for complete search history.

(56) References Cited

U.S. PATENT DOCUMENTS

| | | | |
|---|---|---|---|
| 8,715,886 B1* | 5/2014 | Cable | H01M 4/8846 429/535 |
| 2018/0198009 A1 | 7/2018 | He et al. | |
| 2018/0351040 A1* | 12/2018 | Matias | H01L 33/18 |

FOREIGN PATENT DOCUMENTS

CN    107507876 A    12/2017

OTHER PUBLICATIONS

Cui, S., et al., "Room-Temperature Fabricated Amorphous Ga2O3 High-Response-Speed Solar-Blind Photodetector on Rigid and Flexible Substrates," Advanced Optical Materials, Jul. 24, 2017, pp. 1700454 (1-9), Wiley-VCH Verlag GmbH & Co, KGaA, Weinheim.
(Continued)

*Primary Examiner* — Jaehwan Oh
(74) *Attorney, Agent, or Firm* — PATENT PORTFOLIO BUILDERS PLLC

(57) ABSTRACT

An optoelectronic device includes a flexible substrate, a cerium oxide ($CeO_2$) layer arranged on the flexible substrate, a single crystal β-III-oxide layer arranged on the $CeO_2$ layer,
(Continued)

and a metallic contact layer arranged on the single crystal β-III-oxide layer.

19 Claims, 4 Drawing Sheets

(51) Int. Cl.
| | |
|---|---|
| C23C 16/40 | (2006.01) |
| C30B 23/02 | (2006.01) |
| C30B 25/18 | (2006.01) |
| C30B 29/16 | (2006.01) |
| G01J 1/42 | (2006.01) |
| H01L 31/0224 | (2006.01) |
| H01L 31/0392 | (2006.01) |
| H01L 31/18 | (2006.01) |

(52) U.S. Cl.
CPC .............. *C30B 25/18* (2013.01); *C30B 29/16* (2013.01); *G01J 1/429* (2013.01); *H01L 31/022408* (2013.01); *H01L 31/03926* (2013.01); *H01L 31/18* (2013.01)

(56) References Cited

OTHER PUBLICATIONS

Gogova, D., et al., "Structural properties of Si-doped B—Ga2O3 Layers Grown by MOVPE," Journal of Crystal Growth, Nov. 28, 2013, vol. 401, pp. 665-669, Elsevier B.V.
International Search Report in corresponding/related International Application No. PCT/IB2020/060425, date of mailing Feb. 9, 2021.
Wang, S., et al., "In situ Synthesis of Monoclinic B—Ga2O3 Nanowires on Flexible Substrate and Solar-Blind Photodector," Journal of Alloys and Compounds, Feb. 6, 2019, vol. 787, pp. 133-139, Elsevier B.V.
Written Opinion of the International Searching Authority in corresponding/related International Application No. PCT/IB2020/060425, date of mailing Feb. 9, 2021.
Yu, F.-P., et al., "Plused Laser Deposition of Gallium Oxide Films for High Performance Solar-Blind Photodetectors," Optical Materials, Express, Apr. 30, 2015, vol. 5, No. 5, pp. 1240-1249.

* cited by examiner

OPTOELECTRONIC DEVICE FORMED ON A FLEXIBLE SUBSTRATE

CROSS-REFERENCE TO RELATED APPLICATIONS

This application is a U.S. National Stage Application of International Application No. PCT/IB2020/060425, filed on Nov. 5, 2020, which claims priority to U.S. Provisional Patent Application No. 62/934,046, filed on Nov. 12, 2019, entitled "EPITAXIAL GROWTH OF HIGH CRYSTAL QUALITY β-Ga2O3 THIN FILMS ON CeO2-BUFFERED FLEXIBLE SUBSTRATE," the disclosures of which are incorporated herein by reference in their entirety.

BACKGROUND

Technical Field

Embodiments of the disclosed subject matter generally relate to optoelectronic devices having a III-oxide active layer formed on a flexible substrate.

Discussion Of The Background

III-oxide materials (i.e., materials with oxide in combination with a group-III material, i.e., at least one of aluminum, boron, gallium, and indium) have a number advantageous properties, including a large bandgap range. Thus, III-oxides are often used in optoelectronic devices, such as photodetectors. For example, thin film $Ga_2O_3$ is often used in deep ultra-violet (DUV) photodetectors that detect radiation in the range of approximately 100-280 nm. These photodetectors can accordingly be used in a number of applications, including monitoring ozone holes, detecting flame, space communication, missile guidance, biochemical detection, and inspection of UV leakage. In many applications, it is desirable for the III-oxide layer to be on a flexible substrate.

There are currently a limited number of ways of forming $Ga_2O_3$ thin film on a flexible substrate. For example, Reference [1] discloses growing single crystal β-$Ga_2O_3$ thin film on rigid sapphire substrates. The thin film can then be removed from the sapphire substrate and transferred to a flexible substrate. The removal and transfer of the single crystal β-$Ga_2O_3$ thin film from a rigid sapphire substrate to a flexible substrate is very complicated and suffers from low reproducibility (i.e., successful transfer cannot reliably be repeated using any particular transfer technique).

Reference [2] discloses growing amorphous $Ga_2O_3$ thin film on a flexible substrate. Amorphous $Ga_2O_3$ has low thermal stability, which limits the applications for a photodetector having amorphous $Ga_2O_3$. In contrast, single crystal β-$Ga_2O_3$ has a high thermal stability, and thus can be used in extreme environments. Furthermore, devices formed using amorphous $Ga_2O_3$ typically do not perform as well as those formed using single crystal $Ga_2O_3$.

Reference [3] discloses growing polycrystalline β-$Ga_2O_3$ on flexible silica substrates. In contrast to single crystal β-$Ga_2O_3$, polycrystalline β-$Ga_2O_3$ suffers from high leaking-current.

Thus, it would be desirable to provide methods for forming optoelectronic devices having a crystallized III-oxide thin film on a flexible substrate without requiring transferring the crystallized III-oxide thin film from a rigid substrate to the flexible substrate. It would also be desirable to provide methods for forming optoelectronic devices having a crystallized III-oxide thin film on a flexible substrate that possess high thermal stability and do not suffer from high leaking-current.

SUMMARY

According to an embodiment, there is an optoelectronic device, which includes a flexible substrate, a cerium oxide ($CeO_2$) layer arranged on the flexible substrate, a single crystal β-III-oxide layer arranged on the $CeO_2$ layer, and a metallic contact layer arranged on the single crystal β-III-oxide layer.

According to another embodiment, there is a method for forming an optoelectronic device. A flexible substrate is provided and a cerium oxide ($CeO_2$) layer is formed on the flexible substrate. A single crystal β-III-oxide layer is formed on the $CeO_2$ layer. A metallic contact layer is formed on the single crystal β-III-oxide layer.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of III-oxides.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
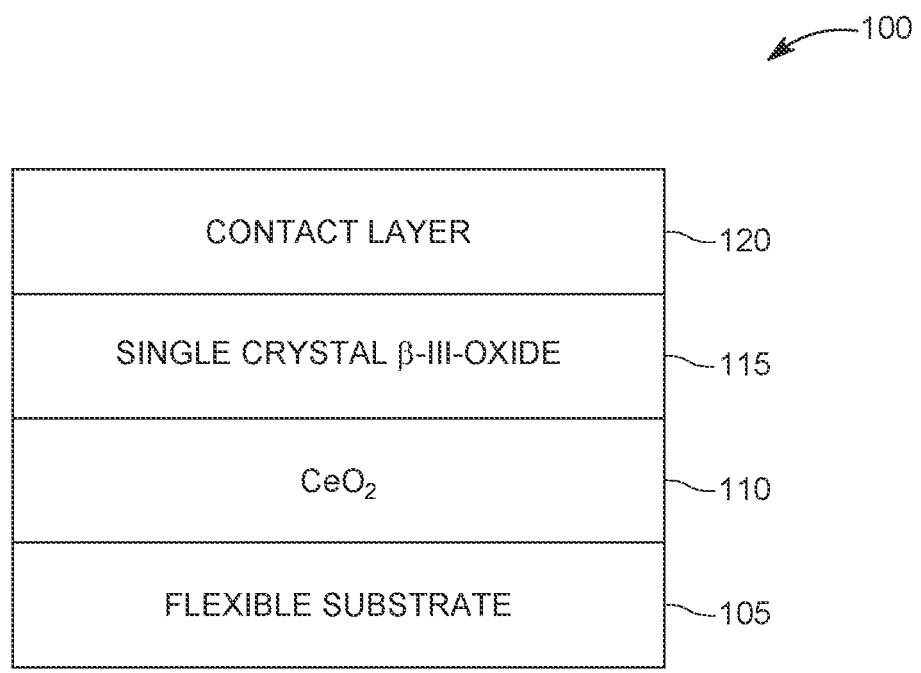
FIG. 1 is a schematic diagram of an optoelectronic device according to embodiments.

FIG. 1 illustrates an optoelectronic device 100, which includes a flexible substrate 105, a cerium oxide ($CeO_2$) layer 110 arranged on the flexible substrate 105, a single crystal β-III-oxide layer 115 arranged on the $CeO_2$ layer 110, and a metallic contact layer 120 arranged on the single crystal β-III-oxide layer 115. It will be recognized that a low lattice-mismatch between the single crystal β-III-oxide layer 115 and the layer on which it is grown, the $CeO_2$ layer 110 in this disclosure, is critical for epitaxial growth of a single crystal III-oxide layer. In this disclosure, it is advantageous to grow the single crystal β-III-oxide layer 115 on the $CeO_2$ layer 110 because of the low lattice-mismatch (in two directions that are perpendicular with each other, i.e., $Ga_2O_3$ (–201) plane grown on $CeO_2$ (001)) between these two layers; the lattice mismatch being in the range of 4%-11%. The low lattice-mismatch in two directions perpendicular to each other arises due to the twelve-fold symmetry of the single crystal β-III-oxide layer 115 grown on the $CeO_2$ layer 110, whereas a single crystal β-III-oxide layer grown on a sapphire substrate has a low lattice-mismatch in one direction due to the six-fold symmetry of the single crystal β-III-oxide layer grown on sapphire.

As used herein, the term flexible substrate refers to a substrate that can be repeatably bent down to a radii of 8 mm without cracking. In an embodiment, the flexible substrate 105 is a metal (e.g., copper or silver) or metal alloy substrate. This is particularly advantageous because a metal or metal alloy substrate is able to withstand the high temperatures required to grow the single crystal β-III-oxide layer 115. In an embodiment, the flexible substrate is a superalloy. For example, the superalloy can be a nitrogen-, iron-, or copper-superalloy. Although the flexible substrate 105 has been described as a metal, metal alloy, or metal superalloy, the flexible substrate can be comprised of any material that can be repeatably bent down to a radii of 8 mm without cracking and can withstand the growth temperature of the single crystal β-III-oxide layer 115, which can be between approximately 600° C. and 1,000° C. Thus, a flexible substrate that is stable at growth temperatures of at least 600° C. can be employed. Those skilled in the art can easily identify a number of different substrates satisfying these conditions.

In some cases, the $CeO_2$ layer 110 can be grown directly on the flexible substrate 105. In other cases, the upper surface of the flexible substrate may be rough resulting in a large lattice-mismatch between the $CeO_2$ layer 110 and the substrate 105. In this case, buffer or planarization layer(s) can be interposed between the $CeO_2$ layer 110 and the substrate 105. In a non-limiting embodiment, the buffer layers can include a layer of amorphous $Al_2O_3$ formed on the flexible substrate 105 and a layer of amorphous $Y_2O_3$ formed on the amorphous $Al_2O_3$ layer. Those skilled in the art can easily identify whether a buffer or planarization layer(s) is required for a particular flexible substrate based on known measurements of surface roughness. Those skilled in the art can also identify, based on the known measurements of surface roughness, the number and composition of buffer or planarization layer(s) to address the surface roughness.

The single crystal β-III-oxide layer 115 can comprise aluminum oxide ($AlO_3$), boron oxide ($BO_3$), gallium oxide ($GaO_3$), or indium oxide ($InO_3$). Furthermore, the single crystal β-III-oxide layer 115 can comprise a group-III alloy, i.e., a combination of oxide and more than one of aluminum, boron, gallium, and indium. In one non-limiting embodiment, the single crystal β-III-oxide layer 115 comprises single crystal $β-Ga_2O_3$.

Figure 4:
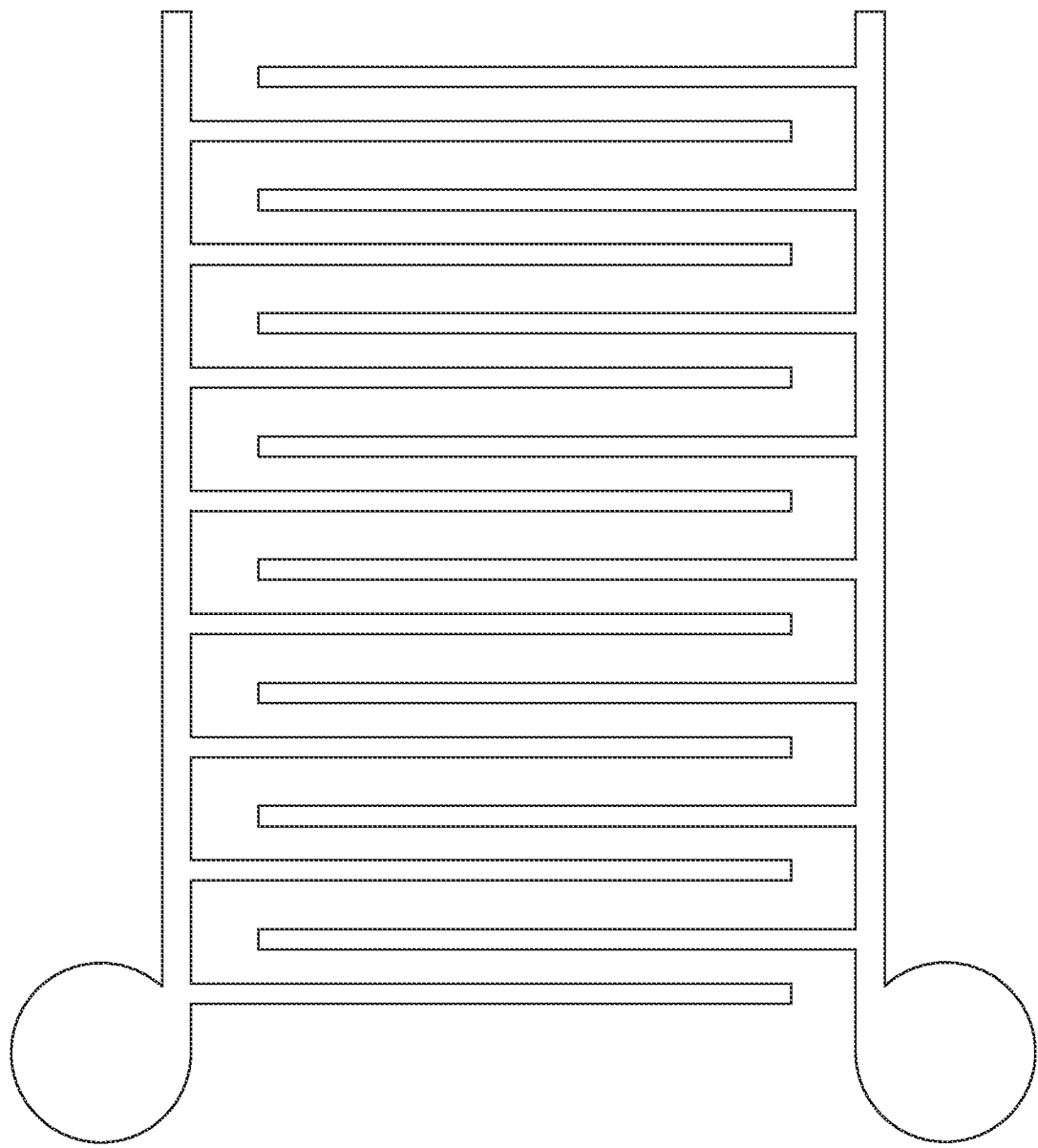
FIG. 4 is a schematic diagram of interdigitated contacts according to embodiments.

In an embodiment, the metallic contact layer 120 comprises a pair of interdigitated contacts, a non-limiting example of which is illustrated in FIG. 4. In a non-limiting embodiment, the pair of interdigitated contacts comprise titanium and gold. It should be recognized, however, that the metallic contact layer 120 can take any desired form depending upon implementation of the optoelectronic device 100.

In an embodiment, the optoelectronic device is a deep ultraviolet photodetector. Specifically, III-oxides have a band gap corresponding to wavelengths in the range of 100-350 nm, which covers the wavelength ranges of 100-200 nm for diatomic oxygen and 200-280 nm for triatomic oxygen in the atmosphere that is typically used by solar-blind deep ultraviolet (DUV) photodetectors.

Figure 2:
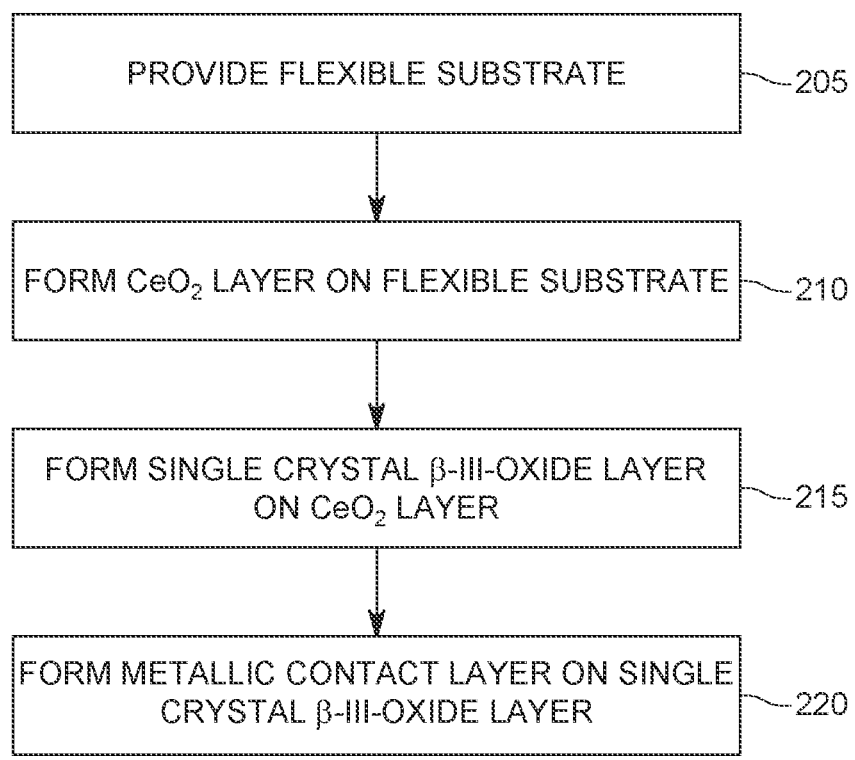
FIG. 2 is a flow diagram of a method for forming an optoelectronic device according to embodiments.

FIG. 2 is a flowchart of a method for forming an optoelectronic device 100 according to embodiments. Initially, a flexible substrate 105 is provided (step 205). A cerium oxide ($CeO_2$) layer 110 is then formed on the flexible substrate 105 (step 210). A single crystal β-III-oxide layer 115 is formed on the $CeO_2$ layer 110 (step 215). A metallic contact layer 120 is formed on the single crystal β-III-oxide layer 115 (step 220). Unlike prior methods in which the single crystal β-III-oxide layer is first formed on a rigid substrate and then transferred to a flexible substrate, the optoelectronic device 100 can be formed entirely within a single growth chamber using a single growth process. Alternatively, the $CeO_2$ layer 110 and single crystal β-III-oxide layer can be formed in a single growth chamber using a single growth process and the metallic contact layer 120 can be formed in a separate growth process in the same or different growth chamber. The growth process can be any suitable growth process for III-oxides, including metal-organic chemical vapor deposition (MOCVD), pulsed laser deposition (PLD), chemical solution deposition (CSD), or molecular-beam epitaxy (MBE).

It should be recognized that the composition of the flexible substrate 105, the flexibility of the flexible substrate 105, and the composition of the single crystal β-III-oxide layer 115 produced by the method described in connection with FIG. 2 are the same as described above in connection with FIG. 1.

Figure 3:
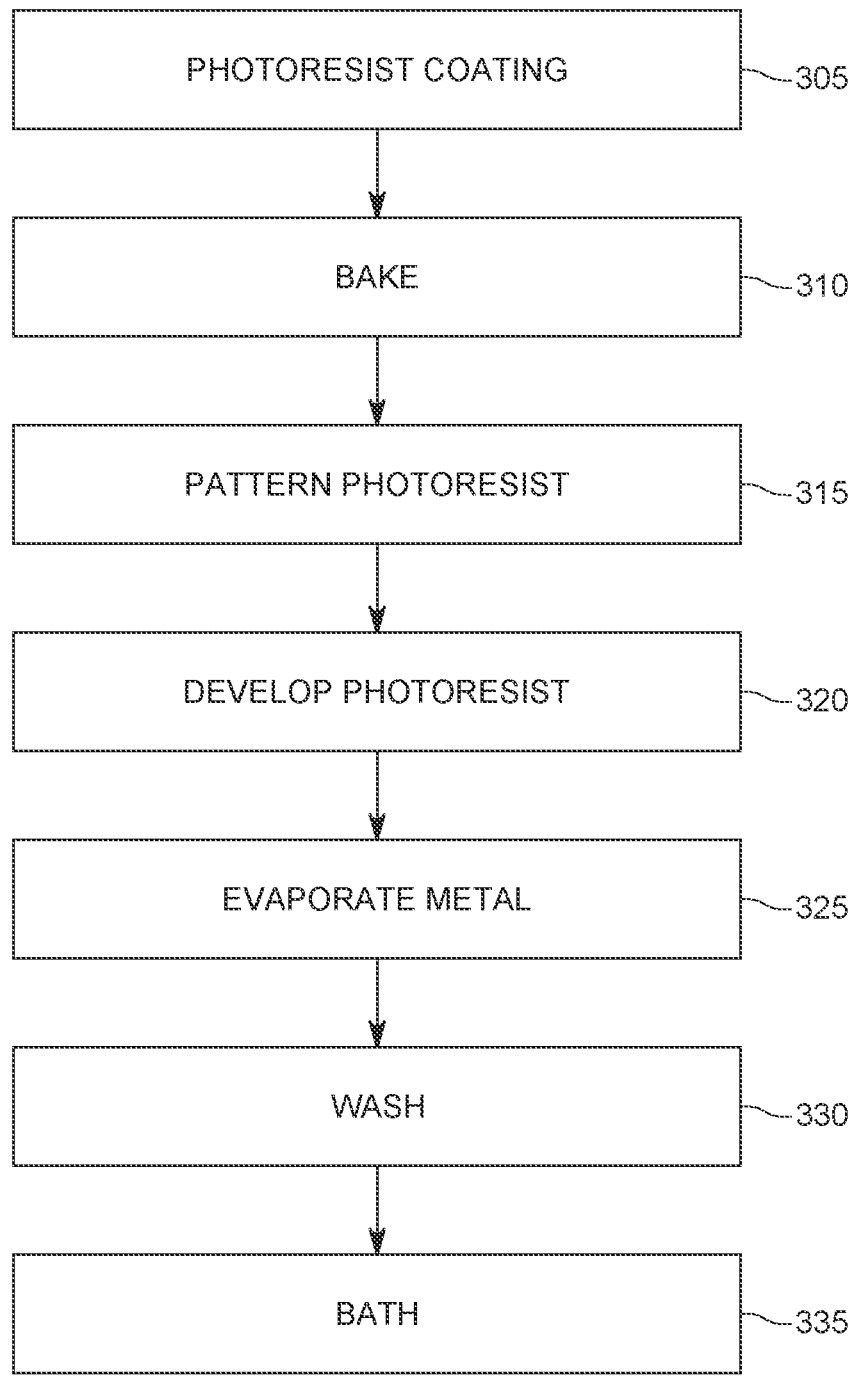
FIG. 3 is a flow diagram of a method for forming a metallic contact layer for an optoelectronic device according to embodiments.

FIG. 3 is a flow chart of a method for forming a metallic contact layer according to embodiments. The structure comprising the flexible substrate 105, $CeO_2$ layer 110, and single crystal β-III-oxide layer 115 is used. First, a photoresist coating is applied to the single crystal β-III-oxide layer 115 (step 305), and the structure is baked (step 310). The baked photoresist is then patterned into the desired pattern of the metallic contact layer 120 (step 315), followed by development (step 320). The metal for the metallic contact layer 120 is then evaporated onto the patterned photoresist so that it adheres to areas that are not covered by photoresist (step 325). The structure is then washed (step 330) and subjected to an ultrasonic bath (step 335). This method of forming the metallic contact layer should be understood as a non-limiting example and that other techniques for forming metallic contact layers can be employed.

Although embodiments have been described as forming a single crystal β-III-oxide layer 115 grown on the $CeO_2$ layer 110, which in turn is formed on a flexible substrate, a single crystal β-III-oxide layer can be grown on a $CeO_2$ layer, which in turn is grown on a rigid substrate.

The disclosed embodiments provide an optoelectronic device with a single crystal III-oxide layer that can be formed on a flexible substrate. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Yu, F.-P., et al. (2015). "Pulsed laser deposition of gallium oxide films for high performance solar-blind photodetectors." Optical Materials Express 5(5).
[2] Cui, S., et al. (2017). "Room-Temperature Fabricated Amorphous $Ga_2O_3$ High-Response-Speed Solar-Blind Photodetector on Rigid and Flexible Substrates." Advanced Optical Materials 5(19).
[3] Wang, S., et al. (2019). "In situ synthesis of monoclinic $\beta$-$Ga_2O_3$ nanowires on flexible substrate and solar-blind photodetector." Journal of Alloys and Compounds 787: 133-139.

What is claimed is:

1. An optoelectronic device, comprising:
a flexible substrate;
a cerium oxide, $CeO_2$, layer arranged on the flexible substrate;
a single crystal $\beta$-III-oxide layer arranged on the $CeO_2$ layer; and
a metallic contact layer arranged on the single crystal $\beta$-III-oxide layer.

2. The optoelectronic device of claim 1, wherein the flexible substrate is a metal or metal alloy substrate.

3. The optoelectronic device of claim 1, wherein the single crystal $\beta$-III-oxide layer includes a group-III alloy.

4. The optoelectronic device of claim 1, wherein the flexible substrate can be repeatably bent down to a radii of 8 mm without cracking.

5. The optoelectronic device of claim 1, wherein the flexible substrate is a superalloy.

6. The optoelectronic device of claim 5, wherein the superalloy is a nitrogen-, iron-, or copper-superalloy.

7. The optoelectronic device of claim 1, wherein the flexible substrate has an operation temperature above 600° C.

8. The optoelectronic device of claim 1, wherein the metallic contact layer comprises a pair of interdigitated contacts.

9. The optoelectronic device of claim 8, wherein the pair of interdigitated contacts comprise titanium and gold.

10. The optoelectronic device of claim 1, wherein optoelectronic device is a deep ultraviolet photodetector.

11. A method for forming an optoelectronic device, the method comprising:
providing a flexible substrate;
forming a cerium oxide, $CeO_2$, layer on the flexible substrate;
forming a single crystal $\beta$-III-oxide layer on the $CeO_2$ layer; and
forming a metallic contact layer on the single crystal $\beta$-III-oxide layer.

12. The method of claim 11, wherein the flexible substrate is a metal or metal alloy substrate.

13. The method of claim 11, wherein the single crystal $\beta$-III-oxide layer includes a group-III alloy.

14. The method of claim 11, wherein the flexible substrate can be repeatably bent down to a radii of 8 mm without cracking.

15. The method of claim 11, wherein the flexible substrate is a superalloy.

16. The method of claim 15, wherein the superalloy is a nitrogen-, iron-, or copper-superalloy.

17. The method of claim 11, wherein the flexible substrate has an operation temperature above 600° C.

18. The method of claim 11, wherein the formation of the metallic contact layer comprises:
forming an interdigitated pattern on the single crystal $\beta$-III-oxide layer; and
evaporating metal on the interdigitated pattern to form a pair of interdigitated contacts.

19. The method of claim 11, wherein the optoelectronic device is formed using a metal-organic chemical vapor deposition (MOCVD), pulsed laser deposition (PLD), chemical solution deposition (CSD), or molecular-beam epitaxy (MBE) process.

* * * * *